(12) United States Patent
Kamibaba et al.

(10) Patent No.: US 11,398,563 B2
(45) Date of Patent: Jul. 26, 2022

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Ryu Kamibaba, Tokyo (JP); Tetsuo Takahashi, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 76 days.

(21) Appl. No.: 16/225,186

(22) Filed: Dec. 19, 2018

(65) Prior Publication Data

US 2020/0006538 A1    Jan. 2, 2020

(30) Foreign Application Priority Data

Jun. 27, 2018    (JP) .............................. JP2018-122257

(51) Int. Cl.
*H01L 29/08*        (2006.01)
*H01L 29/739*       (2006.01)
(Continued)

(52) U.S. Cl.
CPC ...... *H01L 29/7397* (2013.01); *H01L 21/0465* (2013.01); *H01L 27/0629* (2013.01); *H01L 29/083* (2013.01); *H01L 29/7813* (2013.01)

(58) Field of Classification Search
CPC ... H01L 29/7395–7397; H01L 29/8613; H01L 21/0465; H01L 29/0607–0646
See application file for complete search history.

(56) References Cited

U.S. PATENT DOCUMENTS

| 5,360,984 A | * | 11/1994 | Kirihata | .............. | H01L 27/0617 |
| | | | | | 257/139 |
| 9,536,875 B2 | * | 1/2017 | Tamura | .............. | H01L 29/1095 |

(Continued)

FOREIGN PATENT DOCUMENTS

| JP | 2005-057235 A | 3/2005 |
| JP | 2012-129504 A | 7/2012 |

(Continued)

OTHER PUBLICATIONS

An Office Action; "Notice of Reasons for Refusal," dated by the Japanese Patent Office dated Mar. 23, 2021, which corresponds to Japanese Patent Application No. 2018-122257 and is related to U.S. Appl. No. 16/225,186 with English language translation.

(Continued)

*Primary Examiner* — Jarrett J Stark
(74) *Attorney, Agent, or Firm* — Studebaker & Brackett PC

(57) ABSTRACT

Examples of a semiconductor device includes a transistor region formed in a semiconductor substrate having a first conductivity type drift layer, and a diode region formed to be adjacent to the transistor region in the semiconductor substrate, wherein the diode region has a second conductivity type anode layer formed on the drift layer and a first conductivity type cathode layer formed on the lower side of the drift layer, and the cathode layer has an adjacent region contacting the transistor region, the adjacent region having a depth, from a lower surface of the semiconductor substrate, which becomes shallower toward the transistor region and having first conductivity type impurity concentration which decreases toward the transistor region.

8 Claims, 5 Drawing Sheets

(51) Int. Cl.
*H01L 29/78* (2006.01)
*H01L 27/06* (2006.01)
*H01L 21/04* (2006.01)

(56) References Cited

U.S. PATENT DOCUMENTS

| | | | |
|---|---|---|---|
| 2005/0017290 A1* | 1/2005 | Takahashi | H01L 29/0696 257/328 |
| 2010/0289032 A1* | 11/2010 | Zhang | H01L 29/0661 257/77 |
| 2012/0132954 A1* | 5/2012 | Kouno | H01L 29/0696 257/140 |
| 2014/0070266 A1 | 3/2014 | Matsudai et al. | |
| 2014/0084337 A1 | 3/2014 | Matsudai et al. | |
| 2016/0163696 A1 | 6/2016 | Takahashi | |
| 2016/0329322 A1* | 11/2016 | Takahashi | H01L 29/0619 |
| 2017/0047322 A1* | 2/2017 | Yoshida | H01L 29/739 |
| 2019/0027591 A1* | 1/2019 | Naito | H01L 29/083 |
| 2020/0058779 A1* | 2/2020 | Gejo | H01L 29/0804 |

FOREIGN PATENT DOCUMENTS

| | | |
|---|---|---|
| JP | 2013-080796 A | 5/2013 |
| JP | 2014-056942 A | 3/2014 |
| JP | 2014-103376 A | 6/2014 |
| JP | 2015-106695 A | 6/2015 |
| JP | 2016-111077 A | 6/2016 |

OTHER PUBLICATIONS

An Office Action; "Notice of Reasons for Refusal", dated by the Japanese Patent Office dated Oct. 12, 2021, which corresponds to Japanese Patent Application No. 2018-122257 and is related to U.S. Appl. No. 16/225,186; with English language translation.

* cited by examiner

SEMICONDUCTOR DEVICE AND METHOD FOR MANUFACTURING SEMICONDUCTOR DEVICE

BACKGROUND

Field

Examples are described which relate to a semiconductor device and a method for manufacturing the semiconductor device.

Background Art

Most of the inverter devices used in a wide range of areas such as home electrical appliances, electric vehicles, and railroads drive inductive loads such as induction motors. The inverter devices include a plurality of power semiconductor devices such as switching elements (e.g. insulated gate bipolar transistors (IGBTs) and metal-oxide-semiconductor field-effect transistors (MOSFETs)) and reflux diodes (hereinafter simply called "diodes"). Since the inverter devices are required to have high efficiency and operate at low power, a market demand exists for the power semiconductor devices with an improved efficiency and reduced cost.

For improving efficiency and reducing cost of the power semiconductor devices, trench MOS gate structures, thinner semiconductor substrates, reverse-conducting insulated gate bipolar transistors (RC-IGBTs), or the like have been developed. The RC-IGBT represents an integrated transistor in which an IGBT and a diode are included in the same semiconductor substrate. As a method for obtaining excellent electrical characteristics in the RC-IGBTs, an optimum diffusion layer is formed in each of the IGBT and the diode.

Japanese Patent Application Laid-open No. 2012-129504 discloses a RC-IGBT. On the rear surface of the semiconductor device of Japanese Patent Application Laid-open No. 2012-129504, a plurality of n+ type diffusion layers and p type diffusion layers are alternately formed in a diode region. It is proposed in Japanese Patent Application Laid-open No. 2012-129504 that electrons supplied from the side of the rear surface are suppressed overall during a diode operation to suppress a reduction in recovery resistance while reducing recovery characteristics. This is effective for a high-frequency operation. However, there is a likelihood that the recovery resistance reduces when the effective area of the p type diffusion layer is reduced during a low frequency operation.

Generally, in the transistor regions of the RC-IGBTs, the laminated structure of a semiconductor substrate, a barrier metal, a tungsten plug, and a surface electrode is provided. On the side of the surface of the semiconductor substrate, a p+ type diffusion layer, a p type base layer, and an n+ type emitter layer are provided. On the other hand, in the diode regions of the RC-IGBTs, the semiconductor substrate and the surface electrode are provided. Since the barrier metal and the tungsten plug are not formed in the diode regions, ohmic resistance may be formed between a p− type anode layer and the surface electrode even if the p− type anode layer having low impurity concentration is provided.

However, in the transistor region adjacent to the diode region, the p type base layer or the p+ type diffusion layer is formed. Therefore, these layers have a large influence when the RC-IGBTs perform a diode operation. Particularly, during a recovery operation in which a diode switches from an ON-state to an OFF-state, a hole carrier is intensively supplied to the p type base layer or the p+ diffusion layer having lower resistance than the p− type anode layer, which results in an increase in an interrupting current.

SUMMARY

Some examples described herein may address the above-described problems. Some examples described herein may provide a semiconductor device in which a transistor region and a diode region are formed on the same substrate, the semiconductor device having excellent resistance during the recovery operation of a diode, and a method for manufacturing the semiconductor device.

In some examples, a semiconductor device includes a transistor region formed in a semiconductor substrate having a first conductivity type drift layer, and a diode region formed to be adjacent to the transistor region in the semiconductor substrate, wherein the transistor region has a second conductivity type base layer formed on the drift layer, a diffusion layer formed on the base layer and having higher second conductivity type impurity concentration than the base layer, a first conductivity type emitter layer formed on the base layer, a gate electrode contacting the base layer via an insulation film, and a second conductivity type collector layer formed on a lower side of the drift layer, the diode region has a second conductivity type anode layer formed on the drift layer and a first conductivity type cathode layer formed on the lower side of the drift layer, and the cathode layer has an adjacent region contacting the transistor region, the adjacent region having a depth, from a lower surface of the semiconductor substrate, which becomes shallower toward the transistor region and having first conductivity type impurity concentration which decreases toward the transistor region.

Other and further objects, features and advantages will appear more fully from the following description.

DETAILED DESCRIPTION

Hereinafter, embodiments will be described with reference to the accompanying drawings. Since the drawings are schematically shown, the sizes of images and the mutual relationships between positions shown in each of the different drawings will not be necessarily accurate and can be appropriately changed. Further, in the following descriptions, the same or equivalent constituents will be denoted by the same symbols, and their names and functions will also be the same. Accordingly, the detailed descriptions of the same or equivalent constituents will be omitted depending on the circumstances.

Further, in the following descriptions, terms representing specific positions and directions expressed by "upper," "lower," "side," "bottom," "front," "rear," or the like will be used depending on the circumstances. However, these terms will be used for the sake of convenience to facilitate the understanding of the contents of the embodiments and not intend to limit actual implementation directions. Further, semiconductor conductivity types will be described with the assumption that a first conductivity type is an n type and a second conductivity type is a p type. Alternatively, these conductivity types may be regarded in an opposite way. That is, the first conductivity type may be the p type, and the second conductivity type may be the n type. Further, an n+ type will represent a type having higher impurity concentration than the n type, and an n− type will represent a type having lower impurity concentration than the n type. Similarly, a p+ type will represent a type having higher impurity concentration than the p type, and a p− type will represent a type having lower impurity concentration than the p type.

First Embodiment

Figure 1:
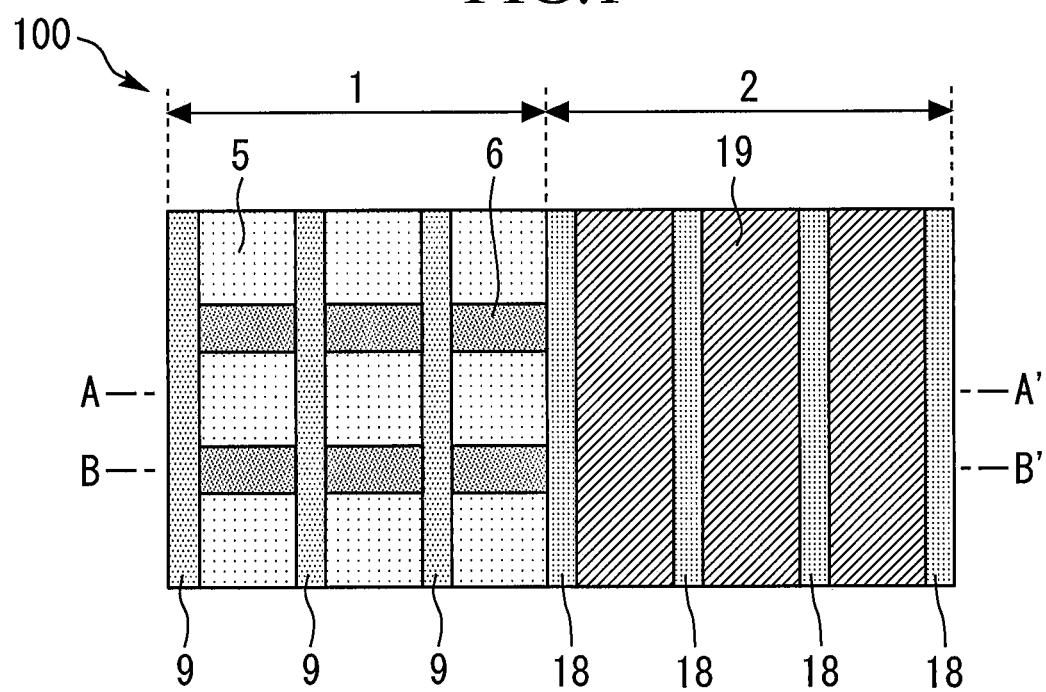
FIG. 1 is a plan view of a semiconductor device.
Figure 2:
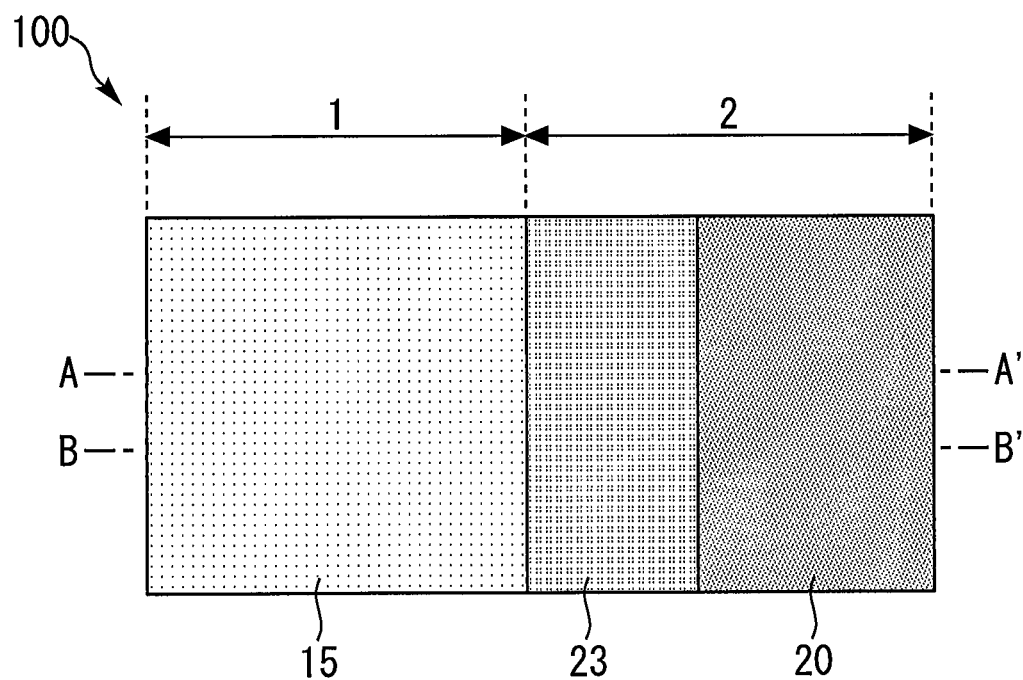
FIG. 2 is a bottom view of the semiconductor device.
Figure 3:
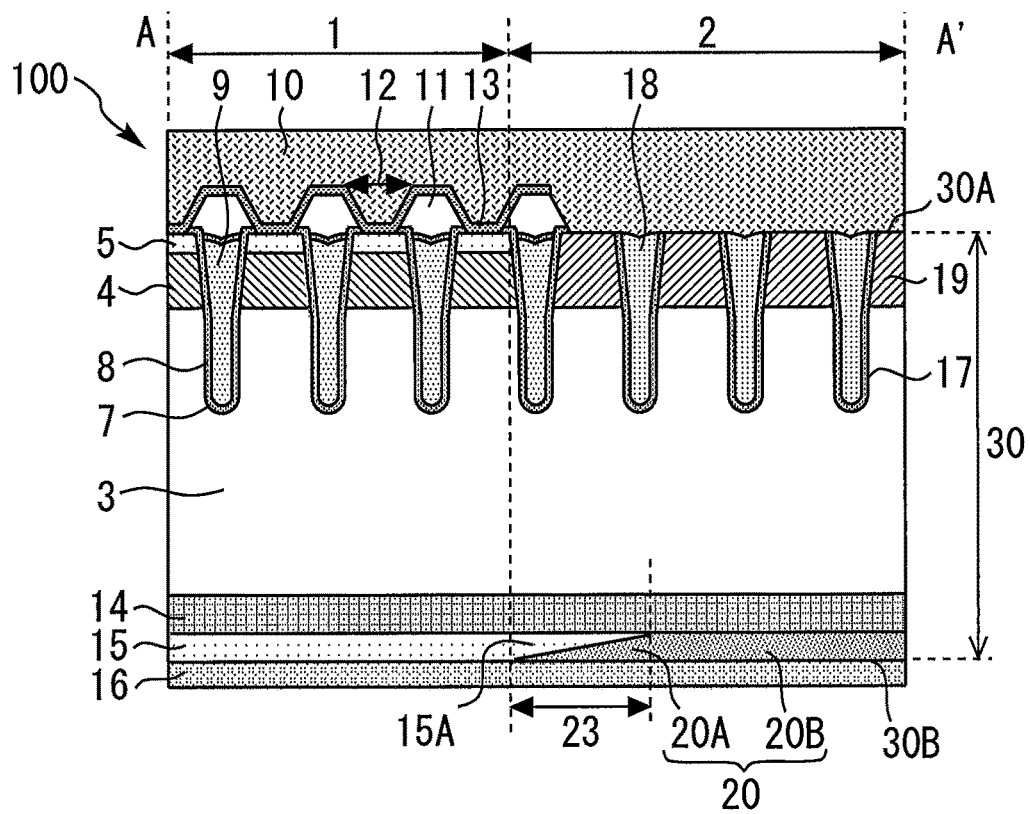
FIG. 3 is a cross-sectional view taken along line A-A' in FIG. 1.
Figure 4:
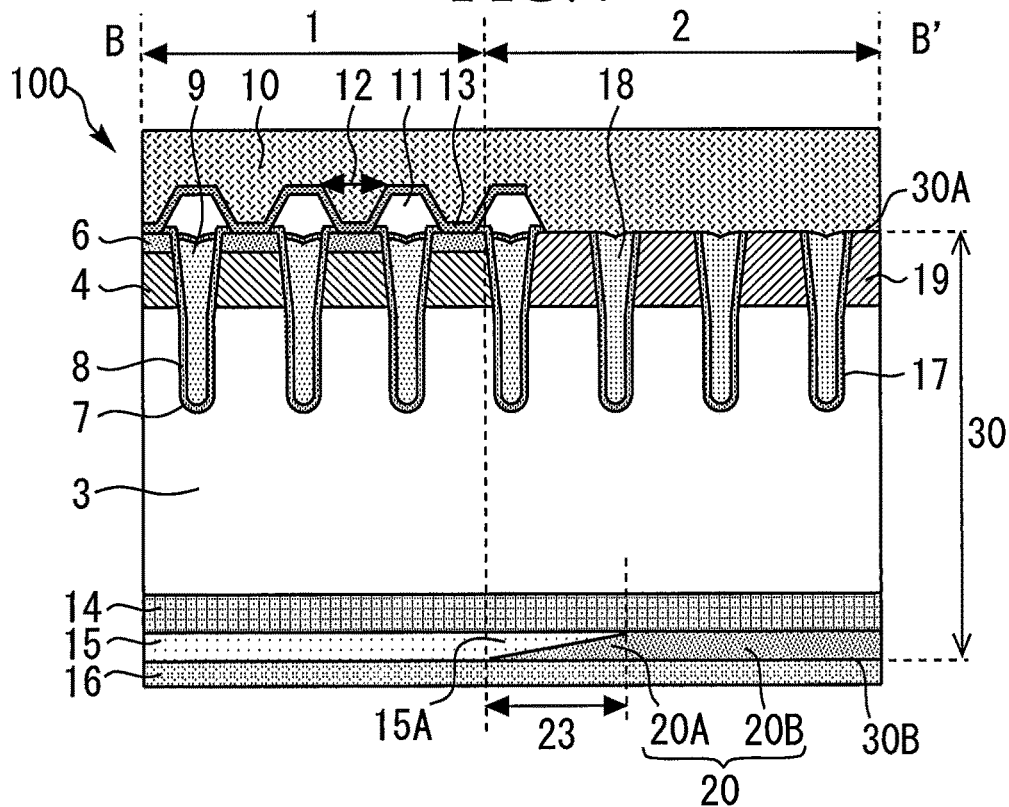
FIG. 4 is a cross-sectional view taken along line B-B' in FIG. 1.

FIG. 1 is a plan view of a semiconductor device 100. The semiconductor device 100 is, for example, a RC-IGBT. FIG. 2 is a bottom view of the semiconductor device 100. In FIGS. 1 and 2, the surface structure and the rear surface structure of the semiconductor device 100 are omitted. FIG. 3 is a cross-sectional view taken along line A-A' in FIG. 1. The line A-A' in FIG. 1 is a line passing through a p+ type diffusion layer 5 of the semiconductor device 100. FIG. 4 is a cross-sectional view taken along line B-B' in FIG. 1. The line B-B' in FIG. 1 is a line passing through an n+ type emitter layer 6 of the semiconductor device 100. In FIGS. 1 to 4, it is shown that a transistor region 1 and a diode region 2 are formed on the same substrate to be adjacent to each other. FIG. 1 is a plan view of a semiconductor substrate 30 in FIGS. 3 and 4, and FIG. 2 is a bottom view of the semiconductor substrate 30 in FIGS. 3 and 4. The material of the semiconductor substrate 30 is, for example, silicon.

First, the configuration of the transistor region 1 will be described. In the transistor region 1, an IGBT is, for example, formed. As shown in FIGS. 3 and 4, the transistor region 1 has an n− type drift layer 3, a p type base layer 4, the p+ type diffusion layer 5, the n+ type emitter layer 6, a gate insulation film 8, a gate electrode 9, a buffer layer 14, and a collector layer 15. The base layer 4 is a p type layer formed on the drift layer 3. The diffusion layer 5 is a layer formed on the base layer 4 and having higher p type impurity concentration than the base layer 4. The emitter layer 6 is an n type layer formed on the base layer 4. Accordingly, the p+ type diffusion layer 5 or the n+ type emitter layer 6 is selectively formed on the base layer 4. Specifically, the diffusion layer 5 is formed on the upper surface of the base layer 4 in a cross section taken along the line A-A' in FIG. 1, and the emitter layer 6 is formed on the upper surface of the base layer 4 in a cross section taken along the line B-B' in FIG. 1. In FIG. 1, it is shown that the n+ type emitter layer 6 surrounds the p+ type diffusion layer 5 in a plan view.

A plurality of trenches 7 penetrating the emitter layer 6 and the base layer 4 from the upper surface of the p+ type diffusion layer 5 or the n+ type emitter layer 6 and reaching the drift layer 3 are formed. In each of the trenches 7, the gate electrode 9 is embedded via the gate insulation film 8. The gate electrode 9 faces the base layer 4 via the gate insulation film 8. In other words, the gate electrode 9 contacts the base layer 4 via the gate insulation film 8. The collector layer 15 is a p type layer formed on the lower side of the drift layer 3 via the n type buffer layer 14. It can be said that the transistor region 1 is formed in the semiconductor substrate 30 having the n− type drift layer 3.

The surface structure of the semiconductor device 100 includes an upper electrode 10 functioning as an emitter electrode, an interlayer insulation film 11, and a barrier metal 13 in the transistor region 1. The interlayer insulation film 11 covers the gate electrode 9, and thus the gate electrode 9 and the upper electrode 10 are insulated from each other. A contact hole 12 is formed in the interlayer insulation film 11, and the diffusion layer 5 and the emitter layer 6 are exposed from the contact hole 12.

The barrier metal 13 is formed on the interlayer insulation film 11 and inside the contact hole 12. The barrier metal 13 inside the contact hole 12 is formed on the diffusion layer 5 and the emitter layer 6 to contact the upper surfaces of the diffusion layer 5 and the emitter layer 6. The barrier metal 13 contacts the semiconductor substrate 30 made of, for example, silicon to be turned into silicide and has the effect of reducing contact resistance with the diffusion layer 5 and the emitter layer 6. In order to realize the miniaturization of a design rule, a tungsten plug may be formed on the barrier metal 13. When the tungsten plug is used in the contact hole 12, the barrier metal 13 may use transition metal or the multilayer structure of, for example, titanium or titanium nitride to obtain the above effect. The upper electrode 10 is formed on the barrier metal 13 or on the barrier metal 13 and the tungsten plug. The upper electrode 10 is, for example, an aluminum alloy. The upper electrode 10 contacts the diffusion layer 5 and the emitter layer 6 via the barrier metal 13.

On the rear surface side of the transistor region 1, the n type buffer layer 14, the p type collector layer 15, and the collector electrode 16 are provided. The semiconductor device 100 may realize high channel density with a trench MOS gate structure having the base layer 4, the diffusion layer 5, the gate insulation film 8, and the gate electrode 9 and realize a low loss with the thinned drift layer 3. The thinned drift layer 3 requires the stopper of a depletion layer extending from the pn junction between the base layer 4 and the drift layer 3 to the drift layer 3 at the time of switching off. Therefore, the n type buffer layer 14 having higher impurity concentration than the drift layer 3 is provided as the stopper. However, the presence or absence of the buffer layer 14 depends on the purpose of a product, and the buffer layer 14 is omitted depending on the circumstances.

When an IGBT formed in the transistor region 1 turns on, an n channel MOSFET having the base layer 4, the emitter layer 6, the gate insulation film 8, and the gate electrode 9 turns on and a current flows in the path of the collector layer 15, the buffer layer 14, the drift layer 3, the base layer 4, and the emitter layer 6. The base layer 4, the emitter layer 6, the gate insulation film 8, and the gate electrode 9 have a transistor structure, more specifically a trench MOS gate structure. In the transistor region 1, a plurality of trench MOS gate structures are formed. The diffusion layer 5 has the effect of discharging a carrier generated when the IGBT turns off and the effect of reducing contact resistance with the upper electrode 10.

Next, the configuration of the diode region 2 will be described. As shown in FIGS. 3 and 4, the diode region 2 is formed in the semiconductor substrate 30. The diode region 2 includes the n− type drift layer 3, a dummy gate electrode 18, a p− type anode layer 19, the n type buffer layer 14, and an n+ type cathode layer 20. The drift layer 3 is common to the transistor region 1 and the diode region 2. In the diode region 2, the p– type anode layer 19 is formed on the upper surface of the drift layer 3. The plurality of trenches 7 penetrating the anode layer 19 from the upper surface of the anode layer 19 and reaching the drift layer 3 are formed. Inside each of the trenches 7, the dummy gate electrode 18 is embedded via a dummy gate insulation film 17.

In the diode region 2, the upper electrode 10 is provided as a surface structure. The upper electrode 10 is common to the transistor region 1 and the diode region 2 and may be made of, for example, an aluminum alloy, or the like. By the common use of the upper electrode 10 between the transistor region 1 and the diode region 2, the same conditions such as wire bonding and solderability may be set between the transistor region 1 and the diode region 2 in the assembly process of the semiconductor device 100. Due to its low p type impurity concentration, the p– type anode layer 19 makes it possible to obtain excellent diode characteristics. However, when the p– type anode layer 19 contacts the barrier metal 13, a Schottky barrier junction is caused, which results in an increase in contact resistance. Therefore, the barrier metal 13 is not provided in the diode region 2. The upper electrode 10 directly contacts the barrier metal 13 in the transistor region 1 and directly contacts the anode layer 19 in the diode region 2.

In the diode region 2, the n type buffer layer 14, the n+ type cathode layer 20, and the collector electrode 16 are formed as the structure of the rear surface side. The buffer layer 14 and the collector electrode 16 are common to the transistor region 1 and the diode region 2. The cathode layer 20 is an n+ type layer formed on the lower side of the drift layer 3 via the buffer layer 14.

In FIGS. 3 and 4, it is shown that the cathode layer 20 includes an adjacent region 20A and a non-adjacent region 20B. The adjacent region 20A contacts the transistor region 1. The non-adjacent region 20B contacts the adjacent region 20A and does not contact the transistor region 1. The adjacent region 20A is a region having the gradient of depth and impurity concentration. Specifically, the adjacent region 20A is a region having a depth, from a lower surface 30B of the semiconductor substrate 30, which becomes shallower toward the transistor region 1 and having n type impurity concentration which decreases toward the transistor region 1. In other words, the adjacent region 20A has the gradient of the depth and the impurity concentration in a direction toward the transistor region 1, i.e., in the horizontal direction of the space of FIG. 3. As a result, the adjacent region 20A has an inclined upper surface as shown in, for example, FIG. 3.

With the provision of the adjacent region 20A having the depth and the concentration which decrease toward the transistor region 1, as described above, electrons supplied from the n+ type cathode layer 20 to the drift layer 3 are suppressed toward the transistor region 1. Therefore, a diode operation near the boundary between the transistor region 1 and the diode region 2 is not completely interrupted, and the degradation of electric characteristics may be minimized.

In FIGS. 3 and 4, a p type layer 15A formed on the adjacent region 20A is shown. The p type layer 15A is provided between the adjacent region 20A and the buffer layer 14. In the manufacturing process of the semiconductor device 100, the p type collector layer 15 is formed on the entire lower surface of the semiconductor substrate 30, and then the cathode layer 20 may be formed. In this case, since the p type layer 15A is formed in the same process as that of the collector layer 15, the p type impurity concentration of the p type layer 15A is the same as or substantially the same as the p type impurity concentration of the collector layer 15. With the provision of the p type layer 15A, the buffer layer 14 contacts the upper surface of the collector layer 15, the upper surface of the p type layer 15A, and the upper surface of the cathode layer 20.

As shown in FIG. 3, the non-adjacent region 20B is a region contacting the adjacent region 20A and separating by a certain distance from the transistor region 1. The non-adjacent region 20B is a region having a constant depth from the lower surface 30B of the semiconductor substrate 30. Further, impurity concentration in the non-adjacent region 20B is uniform or substantially uniform. The non-adjacent region 20B suppresses a reduction in transistor performance by the adjacent region 20A having the gradient of the depth and the impurity concentration of the cathode layer 20. The degree of a distance 23 between the transistor region 1 and the non-adjacent region 20B is set according to various elements such as the product purpose of the semiconductor device 100, the thickness of the drift layer 3, and the concentration of the anode layer 19.

Figure 5:
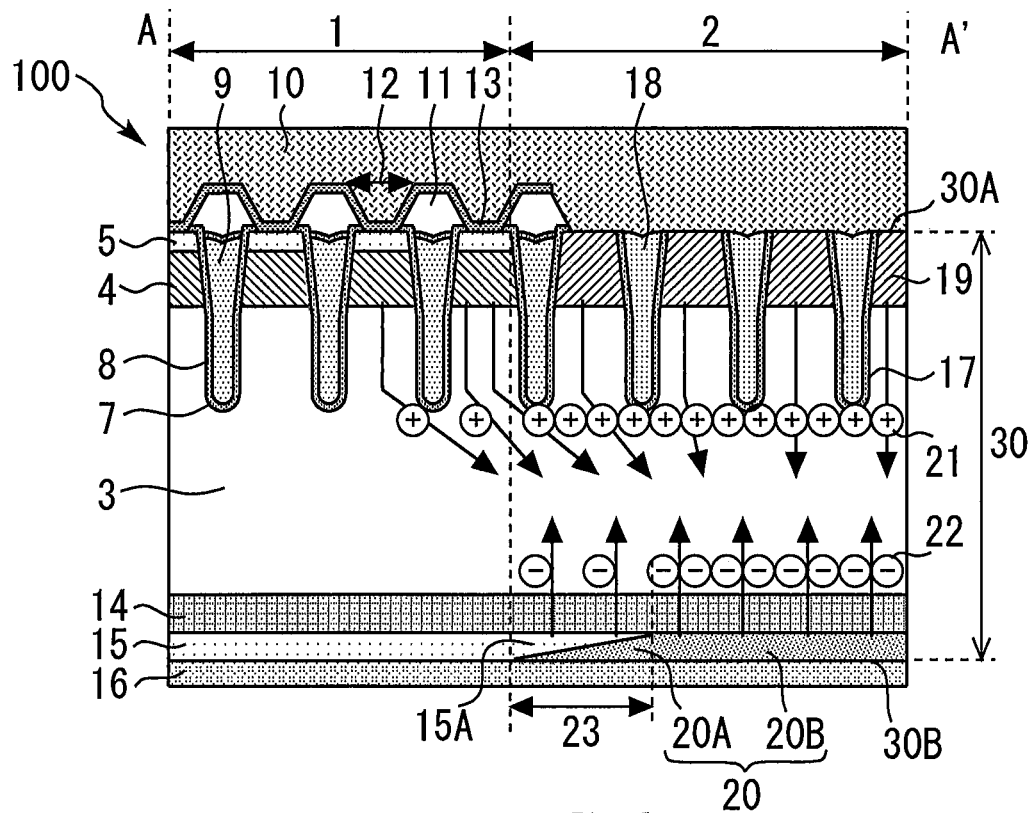
FIG. 5 is a view for describing the ON-operation of a diode.

FIG. 5 is a view for describing the ON-operation of a diode formed in the diode region 2. When a positive voltage is applied between the upper electrode 10 and the collector electrode 16, a hole carrier 21 is injected from the p– type anode layer 19 into the drift layer 3 and an electron carrier 22 is injected from the n+ type cathode layer 20 into the drift layer 3. Then, when the applied voltage becomes a drop voltage or more, the diode switches to an ON-state. When the diode switches to the ON-state, a current flows in the path of the upper electrode 10, the p– type anode layer 19, the n– type drift layer 3, n+ type cathode layer 20, and the collector electrode 16.

Figure 6:
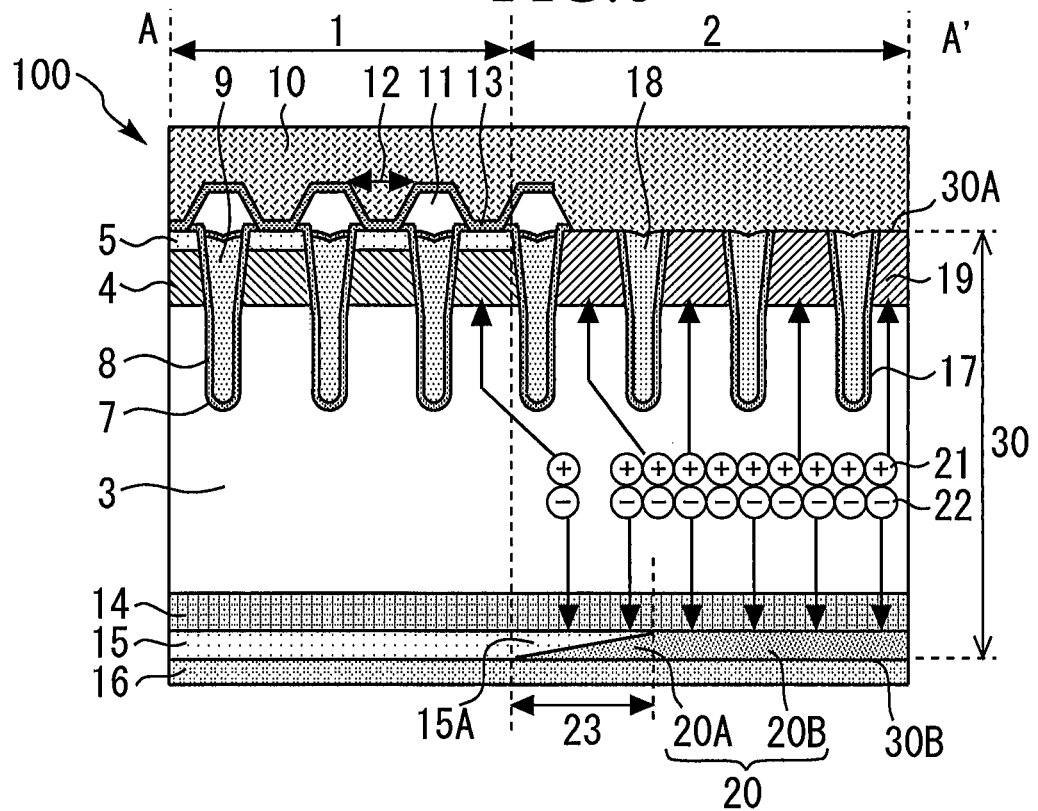
FIG. 6 is a view for describing the OFF-operation of a diode.

FIG. 6 is a view for describing the OFF-operation of a diode. In general, the diode performs a recovery operation when switching from an On-state to an OFF-state. The recovery operation represents an operation in which the diode returns to an OFF-state after a current temporarily flows to the negative side of the diode. The time at which the recovery operation occurs is called a reverse recovery time. In addition, the peak value of a negative current generated during the reverse recovery time is called a recovery current, and a loss generated in the reverse recovery time is called a recovery loss. In a single-diode element, a hole carrier flows to a p– type anode layer, and an electron carrier layer flows to an n+ type cathode layer in a reverse recovery time. On the other hand, the semiconductor device 100 includes the p+ type diffusion layer 5 and the p type base layer 4 in the transistor region 1, and these layers have lower resistance than the p– type anode layer 19. Accordingly, as shown in FIG. 6, the hole carrier 21 flows into the transistor region 1 during the recovery operation, which possibly causes the convergence of a current at the boundary part between the diode region 2 and the transistor region 1. However, with the provision of the adjacent region 20A described above, an amount of electrons supplied from the cathode layer 20 to the drift layer 3 is suppressed toward the boundary between the transistor region 1 and the diode region 2. Then, a hole carrier supplied from the transistor region 1 to the drift layer 3 is also suppressed. Therefore, the hole carrier 21 accumulated in the drift layer 3 during an OFF-operation is not intensively discharged to the p+ type diffusion layer 5 and the p type base layer 4. As a result, excellent recovery resistance may be obtained.

Such an improvement in the recovery resistance is realized without the change of an effective area as a transistor during the ON-operation of the diode. In addition, the semiconductor device 100 according to the first embodiment includes the barrier metal 13 formed between the upper electrode 10 and the p+ type diffusion layer 5 and between the upper electrode 10 and the n+ type emitter layer 6. Further, the p– type anode layer 19 directly contacts the upper electrode 10. Since the barrier metal 13 is not formed in the diode region 2, a reduction in the impurity concentration of the p– type anode layer 19 and an improvement in recovery characteristics may be achieved.

Moreover, since the upper electrode 10 is commonly used between the transistor region 1 and the diode region 2, the same conditions such as wire bonding and solderability may be set between the transistor region 1 and the diode region 2 in an assembly process using RC-IGBT. Further, the upper electrode 10 is embedded in the contact hole 12 to contact a semiconductor layer having a MOS gate structure. Thus, the use of an expensive contact plug such as a tungsten plug may be avoided. This results in a reduction in the manufacturing cost of the RC-IGBT.

A method for manufacturing the semiconductor device 100 will be described. First, in the transistor region 1 and the diode region 2, the n type buffer layer 14 is formed on the lower surface of the n– type drift layer 3. In addition, the p type collector layer is formed on the side of the entire lower surface of the semiconductor substrate 30. A part of the formed collector layer becomes the collector layer 15 of the transistor region 1 and the p type layer 15A of the diode region 2.

Figure 7:
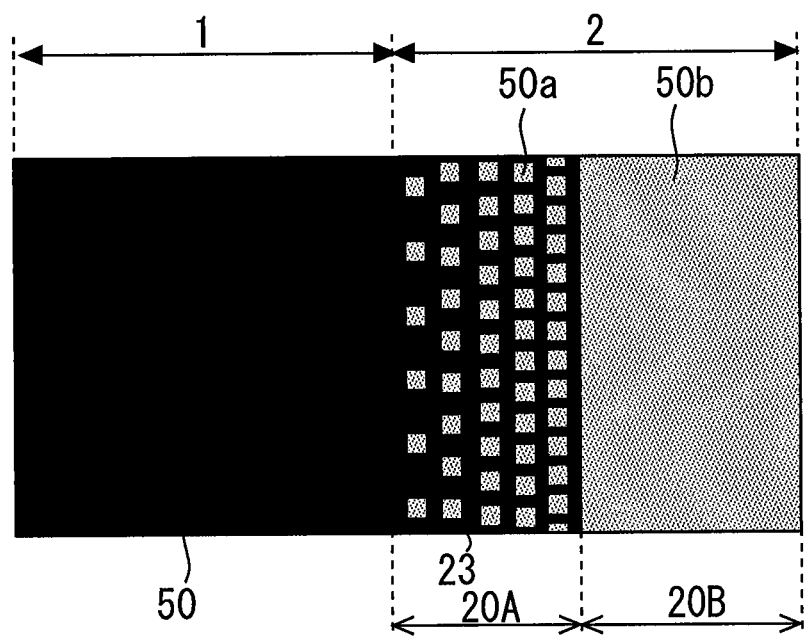
FIG. 7 is a plan view showing an example of a resist mask.

Next, in the diode region 2, the n+ type cathode layer 20 is formed beneath the n type buffer layer 14 in the diode region 2. That is, the n+ type cathode layer 20 is formed on the side of the lower surface of the semiconductor substrate 30. FIG. 7 is a plan view showing an example of a resist mask 50 used for forming the cathode layer 20. The resist mask 50 covers the entire surface of the transistor region 1, but has openings 50a and 50b in the diode region 2. The opening 50a represents a dot pattern. The opening 50a is formed by a plurality of openings. The density of the opening 50a decreases toward the transistor region 1 from the non-adjacent region 20B. In other words, the density of the opening 50a at a place closer to the transistor region 1 is lower than that of the opening 50a at a place distant from the transistor region 1. The opening 50b is a fully-opened portion. With the opening 50b, the resist mask 50 exposes a portion forming the non-adjacent region 20B of the lower surface 30B of the semiconductor substrate 30.

The impurity of the adjacent region 20A is injected via the opening 50a, and the impurity of the non-adjacent region 20B is injected via the opening 50b. The opening 50a of the dot pattern allows the control of ion injection density. By anneal processing after the injection of the impurities, the cathode layer 20 having the adjacent region 20A and the non-adjacent region 20B is formed.

FIG. 7 shows an example of the openings 50a and 50b of the resist mask 50, but the sizes, the shape of the dot pattern, and the densities of the openings are not limited to the example. It is possible to adopt various opening patterns covering at least a part of the lower surface of the transistor region 1 and having opening density decreasing toward the transistor region 1 at a portion forming the adjacent region 20A of the lower surface of the diode region 2. Note that the entire rear surface of the transistor region 1 may be covered with the resist mask 50, or a part of the rear surface of the transistor region 1 may be exposed with a resist mask to inject an ion into a part of the transistor region 1.

With the use of a resist mask having opening density decreasing toward the transistor region 1, the cathode layer 20 described above may be formed in a single ion injection.

Further, since diffusion depth becomes shallower as the impurity concentration of the n+ type cathode layer 20 reduces, the p type layer 15A remains in the diode region 2.

In order to make the n+ type cathode layer 20 have the gradient of the depth and the impurity concentration, it is assumed to perform a photolithography process and an ion injection process a plurality of times and control injection energy and a dose amount in the ion injection process. However, such a method requires a wafer processing process, and thus cost increases.

Second Embodiment

Figure 8:
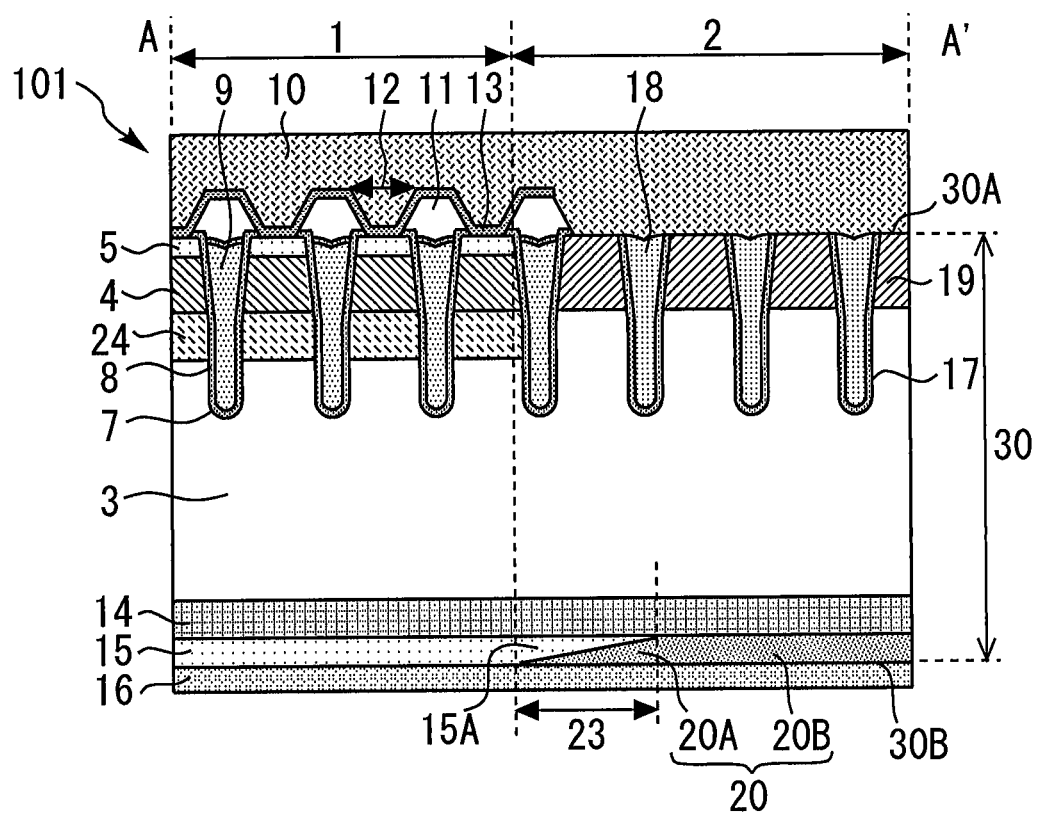
FIG. 8 is a cross-sectional view of a semiconductor device.
Figure 9:
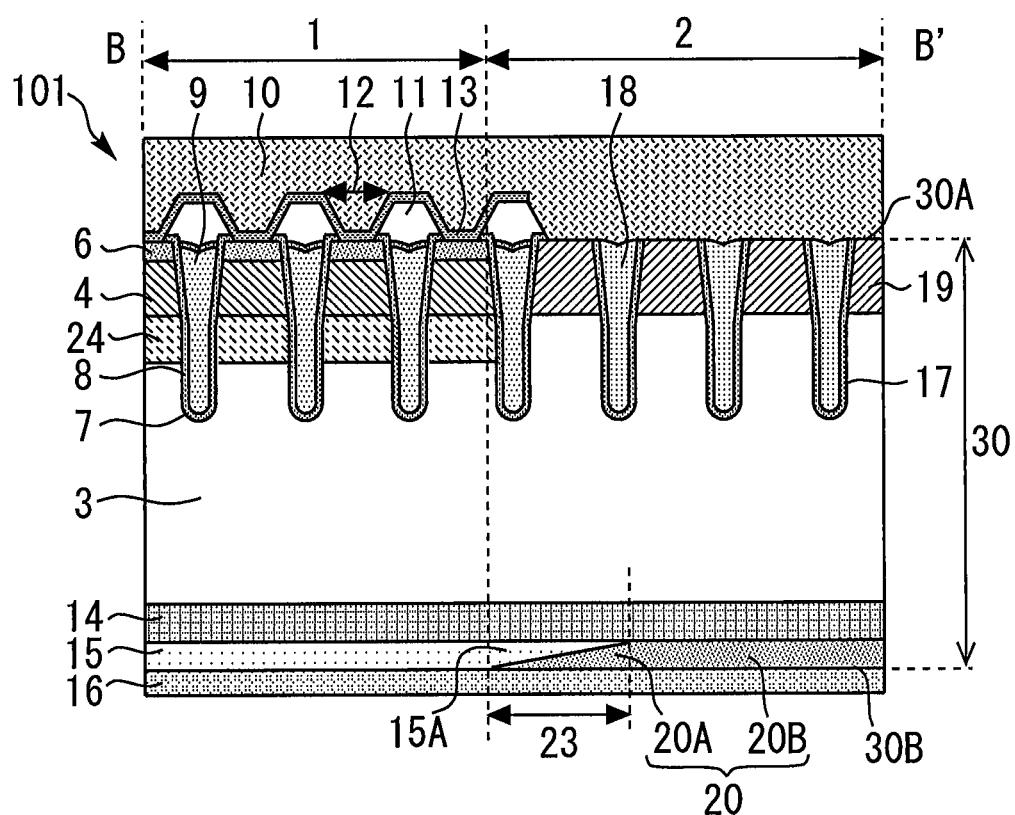
FIG. 9 is a cross-sectional view of a semiconductor device.

FIGS. 8 and 9 are cross-sectional views of a semiconductor device 101 according to a second embodiment. FIG. 8 is a cross-sectional view containing a p+ type diffusion layer 5, and FIG. 9 is a cross-sectional view containing an emitter layer 6. The semiconductor device 101 according to the second embodiment includes an n type carrier storage layer 24 having higher n type impurity concentration than a drift layer 3 between the drift layer 3 and a base layer 4. That is, in a transistor region 1, the n type carrier storage layer 24 is provided on the side of the lower surface of the p type base layer 4. A first effect of providing the carrier storage layer 24 is that a hole carrier supplied from a p+ type diffusion layer 5 and the p type base layer 4 to the drift layer 3 may be suppressed. A second effect of providing the carrier storage layer 24 is that the ON-resistance of the p type base layer 4 and the n– type drift layer 3 may be reduced, an ON-voltage may be reduced, and a steady loss may be reduced during the conduction of a transistor.

According to one example, it is possible to provide excellent resistance during the recovery operation of a diode since a cathode layer has a depth and impurity concentration which decrease toward a transistor region.

The invention claimed is:
1. A semiconductor device comprising:
a transistor region formed in a semiconductor substrate having a first conductivity type drift layer; and
a diode region formed to be adjacent to the transistor region in the semiconductor substrate, wherein
the transistor region has a second conductivity type base layer formed on the drift layer, a diffusion layer formed on the base layer and having higher second conductivity type impurity concentration than the base layer, a first conductivity type emitter layer formed on the base layer, a gate electrode contacting the base layer via an insulation film, and a second conductivity type collector layer formed on a lower side of the drift layer,
the diode region has a second conductivity type anode layer formed on the drift layer and a first conductivity type cathode layer formed on the lower side of the drift layer,
the cathode layer has an adjacent region contacting the transistor region, the adjacent region having a depth, from a lower surface of the semiconductor substrate, which becomes shallower toward the transistor region and having a first conductivity type impurity concentration which decreases toward the transistor region, the adjacent region transitions along an inclined upper surface from the cathode layer to the collector layer,
the base layer has a higher second conductivity type impurity concentration than that of the anode layer, and
a barrier metal is formed on the diffusion layer and the emitter layer in the transistor region but is not formed on the anode layer in the diode region.

2. The semiconductor device according to claim 1, wherein
the cathode layer includes a non-adjacent region contacting the adjacent region and having a constant depth from the lower surface of the semiconductor substrate.

3. The semiconductor device according to claim 1, further comprising,
on the adjacent region, a second conductivity type layer having same impurity concentration as the collector layer.

4. The semiconductor device according to claim 3, further comprising
a first conductivity type buffer layer contacting an upper surface of the collector layer, an upper surface of the second conductivity type layer, and an upper surface of the cathode layer.

5. The semiconductor device according to claim 1, further comprising:
an upper electrode directly contacting the barrier metal and the anode layer.

6. The semiconductor device according to claim 1, further comprising,
between the drift layer and the base layer, a first conductivity type carrier storage layer having higher first conductivity type impurity concentration than the drift layer.

7. The semiconductor device according to claim 1, further comprising:
an upper electrode directly contacting the barrier metal and the anode layer, wherein
the barrier metal layer is between the upper electrode and each of the diffusion layer and the emitter layer in the transistor region but is not formed between the upper electrode and the anode layer in the diode region.

8. A semiconductor device comprising:
a transistor region formed in a semiconductor substrate having a first conductivity type drift layer; and
a diode region formed to be adjacent to the transistor region in the semiconductor substrate, wherein
the transistor region has a second conductivity type base layer formed on the drift layer, a diffusion layer formed on the base layer and having higher second conductivity type impurity concentration than the base layer, a first conductivity type emitter layer formed on the base layer, a gate electrode contacting the base layer via an insulation film, and a second conductivity type collector layer formed on a lower side of the drift layer,
the diode region has a second conductivity type anode layer formed on the drift layer, a first conductivity type cathode layer formed on the lower side of the drift layer, a plurality of trenches penetrating the anode layer from an upper surface of the anode layer and reaching the drift layer, and dummy gate electrodes embedded in the plurality of trenches via dummy gate insulating films respectively, and
the cathode layer has an adjacent region contacting the transistor region, the adjacent region having a depth, from a lower surface of the semiconductor substrate, which becomes shallower toward the transistor region and having first conductivity type impurity concentration which decreases toward the transistor region,
an impurity concentration of the base layer is higher than an impurity concentration of the anode layer, and
the adjacent region is provided over at least an entire area between two adjacent trenches.

\* \* \* \* \*